(12) United States Patent
Abe

(10) Patent No.: US 12,376,392 B2
(45) Date of Patent: Jul. 29, 2025

(54) DETECTION DEVICE

(71) Applicant: Japan Display Inc., Tokyo (JP)

(72) Inventor: Hiroyuki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 286 days.

(21) Appl. No.: 17/842,236

(22) Filed: Jun. 16, 2022

(65) Prior Publication Data

US 2022/0328539 A1  Oct. 13, 2022

Related U.S. Application Data

(63) Continuation of application No. PCT/JP2020/044084, filed on Nov. 26, 2020.

(30) Foreign Application Priority Data

Dec. 23, 2019  (JP) ................................. 2019-232050

(51) Int. Cl.
| | | |
|---|---|---|
| *H01L 27/146* | (2006.01) | |
| *G06V 40/13* | (2022.01) | |
| *H01L 31/105* | (2006.01) | |

(52) U.S. Cl.
CPC .... *H01L 27/14603* (2013.01); *G06V 40/1318* (2022.01); *H01L 27/14612* (2013.01); *H01L 27/14645* (2013.01); *H01L 31/1055* (2013.01)

(58) Field of Classification Search
CPC ......... H01L 27/14603; H01L 27/14612; H01L 27/14645; H01L 31/1055; G06V 40/1318
(Continued)

(56) References Cited

U.S. PATENT DOCUMENTS

| | | | | |
|---|---|---|---|---|
| 2011/0180889 A1* | 7/2011 | Jung | ................. | H01L 27/14663 257/E27.122 |
| 2012/0061578 A1* | 3/2012 | Lim | .................. | H01L 27/14663 250/370.14 |

(Continued)

FOREIGN PATENT DOCUMENTS

| | | |
|---|---|---|
| JP | 2000-340777 A | 12/2000 |
| JP | 2008-085029 A | 4/2008 |

(Continued)

OTHER PUBLICATIONS

Office Action issued in related Japanese Patent Application No. 2019-232050 mailed on Dec. 19, 2023 and English translation of same. 6 pages.

(Continued)

*Primary Examiner* — Carolyn Fin
(74) *Attorney, Agent, or Firm* — K&L Gates LLP

(57) ABSTRACT

According to an aspect, a detection device includes: a substrate; photoelectric conversion elements arranged on the substrate; transistors that each include a semiconductor layer and a gate electrode facing the semiconductor layer and are provided for each photoelectric conversion element; and a first electrode and a second electrode that are provided between the substrate and the photoelectric conversion elements in a direction orthogonal to the substrate and face each other with an insulating film interposed therebetween. The first electrode includes main parts that overlap the respective photoelectric conversion elements and a coupling part couples together adjacent main parts of the main parts. The second electrode is formed to have an island pattern for each photoelectric conversion element. The first electrode is located in the same layer as that of the gate electrode. The second electrode is located in the same layer as that of the semiconductor layer.

7 Claims, 12 Drawing Sheets

(58) Field of Classification Search
USPC .......................................................... 250/255
See application file for complete search history.

(56) References Cited

U.S. PATENT DOCUMENTS

| | | | |
|---|---|---|---|
| 2012/0299070 A1 | 11/2012 | Yamada et al. | |
| 2013/0256544 A1 | 10/2013 | Senda et al. | |
| 2014/0103347 A1* | 4/2014 | Ishino | H01L 27/14689 |
| | | | 438/59 |

FOREIGN PATENT DOCUMENTS

| | | |
|---|---|---|
| JP | 2013-012696 A | 1/2013 |
| JP | 2013-205140 A | 10/2013 |

OTHER PUBLICATIONS

International Search Report issued for International Patent Application No. PCT/JP2020/044084 on Feb. 2, 2021 and English translation of same. 5 pages.
Written Opinion issued for International Patent Application No. PCT/JP2020/044084 on Feb. 2, 2021. 4 pages.
Office Action issued in related Chinese Patent Application No. 202080088010.9 mailed on Oct. 25, 2024 and English translation of same. 14 pages.

* cited by examiner

DETECTION DEVICE

CROSS-REFERENCE TO RELATED APPLICATION

This application claims the benefit of priority from Japanese Patent Application No. 2019-232050 filed on Dec. 23, 2019 and International Patent Application No. PCT/JP2020/044084 filed on Nov. 26, 2020, the entire contents of which are incorporated herein by reference.

BACKGROUND

1. Technical Field

What is disclosed herein relates to a detection device.

2. Description of the Related Art

Japanese Patent Application Laid-open Publication No. 2013-012696 (JP-A-2013-012696) describes a detection device (photoelectric conversion device in JP-A-2013-012696) having a plurality of photoelectric conversion elements such as positive-intrinsic-negative (PIN) photodiodes arranged on a substrate. The photoelectric conversion elements of JP-A-2013-012696 are driven by a drive circuit including three transistors and one capacitor. A signal (electric charge) generated in the photoelectric conversion device is stored in the capacitor. A voltage signal corresponding to the signal stored in the capacitor is output from an output transistor.

The detection device is required to reduce a variation in the signal output from the transistor.

For the foregoing reasons, there is a need for a detection device capable of reducing the variation in the output signal.

SUMMARY

According to an aspect, a detection device includes: a substrate; a plurality of photoelectric conversion elements arranged on the substrate; a plurality of transistors that each include a semiconductor layer and a gate electrode facing the semiconductor layer and are provided for each of the photoelectric conversion elements; and a first electrode and a second electrode that are provided between the substrate and the photoelectric conversion elements in a direction orthogonal to the substrate and face each other with an insulating film interposed between the first electrode and the second electrode. The first electrode includes a plurality of main parts that overlap the respective photoelectric conversion elements and a coupling part couples together adjacent main parts of the main parts. The second electrode is formed to have an island pattern for each of the photoelectric conversion elements. The first electrode is located in the same layer as that of the gate electrode. The second electrode is located in the same layer as that of the semiconductor layer.

According to an aspect, a detection device includes: a substrate; a plurality of photoelectric conversion elements arranged on the substrate; a plurality of transistors that each include a semiconductor layer, a gate electrode facing the semiconductor layer, and a source electrode coupled to the semiconductor layer and are provided for each of the photoelectric conversion elements; and a first electrode and a second electrode that are provided between the substrate and the photoelectric conversion elements in a direction orthogonal to the substrate and face each other with an insulating film interposed between the first electrode and the second electrode. The first electrode includes a plurality of main parts that overlap the respective photoelectric conversion elements and a coupling part that couples together adjacent main parts of the main parts. The second electrode is formed to have an island pattern for each of the photoelectric conversion elements. The first electrode is located in the same layer as that of the gate electrode. The second electrode is located in the same layer as that of the source electrode.

According to an aspect, a detection device includes: a substrate; a plurality of photoelectric conversion elements arranged on the substrate; a plurality of transistors provided for each of the photoelectric conversion elements; and a first electrode and a second electrode that are provided in regions overlapping the transistors and a corresponding one of the photoelectric conversion elements in a plan view and face each other with an insulating film interposed between the first electrode and the second electrode in a direction orthogonal to the substrate. The first electrode is provided on the upper side of the photoelectric conversion element. The second electrode is provided above the first electrode with the insulating film interposed between the first electrode and the second electrode.

DETAILED DESCRIPTION

Figure 1:
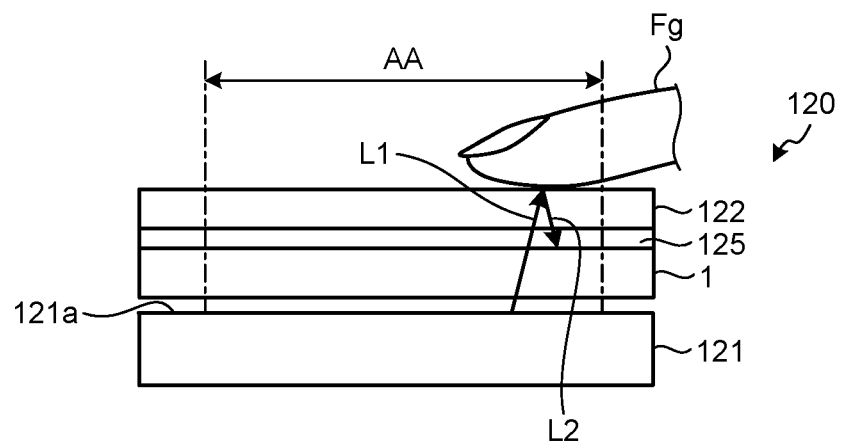
FIG. 1 is a sectional view illustrating a schematic sectional configuration of a detection apparatus having an illumination device, the detection apparatus including a detection device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

FIG. 1 is a sectional view illustrating a schematic sectional configuration of a detection apparatus having an illumination device, the detection apparatus including a detection device according to a first embodiment. As illustrated in FIG. 1, a detection apparatus 120 having an illumination device includes a detection device 1, an illumination device 121, an adhesive layer 125, and a cover member 122. The illumination device 121, the detection device 1, the adhesive layer 125, and the cover member 122 are stacked in this order in a direction orthogonal to a surface of the detection device 1.

The illumination device 121 has a light-emitting surface 121a for emitting light and emits light L1 from the light-emitting surface 121a toward the detection device 1. The illumination device 121 is a backlight. The illumination device 121 may be, for example, what is called a side light-type backlight that includes a light guide plate a plurality of light sources. The light guide plate is provided in a position corresponding to a detection region AA, and the light sources are arranged at one end or both ends of the light guide plate. For example, light-emitting diodes (LEDs) for emitting light in a predetermined color are used as the light sources. The illumination device 121 may be what is called a direct-type backlight that includes the light sources (such as the LEDs) provided directly under the detection region AA. The illumination device 121 is not limited to the backlight, and may be provided on a lateral side or an upper side of the detection device 1 and emit the light L1 from the lateral side or the upper side of a finger Fg.

The detection device 1 is provided so as to face the light-emitting surface 121a of the illumination device 121. The light L1 emitted from the illumination device 121 passes through the detection device 1 and the cover member 122. The detection device 1 can detect asperities (such as a fingerprint) on a surface of the finger Fg by detecting light L2 reflected by the finger Fg. Alternatively, the detection device 1 may detect information on a living body by detecting the light L2 reflected inside the finger Fg in addition to detecting the fingerprint. Examples of the information on the living body include a blood vessel image of a vein or the like, pulsation, and a pulse wave. The color of the light L1 from the illumination device 121 may be varied depending on a detection target.

The cover member 122 is a member for protecting the detection device 1 and the illumination device 121 and covers the detection device 1 and the illumination device 121. The cover member 122 is, for example, a glass substrate. The cover member 122 is not limited to a glass substrate and may be, for example, a resin substrate. The cover member 122 need not be provided. In this case, the surface of the detection device 1 is provided with a protective layer of, for example, an insulating film, and the finger Fg contacts the protective layer of the detection device 1.

The detection apparatus 120 having an illumination device may be provided with a display panel instead of the illumination device 121. The display panel may be, for example, an organic electroluminescent (EL) diode (organic light-emitting diode (OLED)) panel or an inorganic EL display (micro-LED or mini-LED). Alternatively, the display panel may be a liquid crystal display (LCD) panel using liquid crystal elements as display elements or an electrophoretic display (EPD) panel using electrophoretic elements as display elements. Also in this case, display light (light L1) emitted from the display panel passes through the detection device 1, and the fingerprint of the finger Fg and the information on the living body can be detected based on the light L2 reflected by the finger Fg. The stacking order of the display panel and the detection device 1 may be reversed. That is, the display panel may be stacked on the upper side of the detection device 1.

Figure 2:
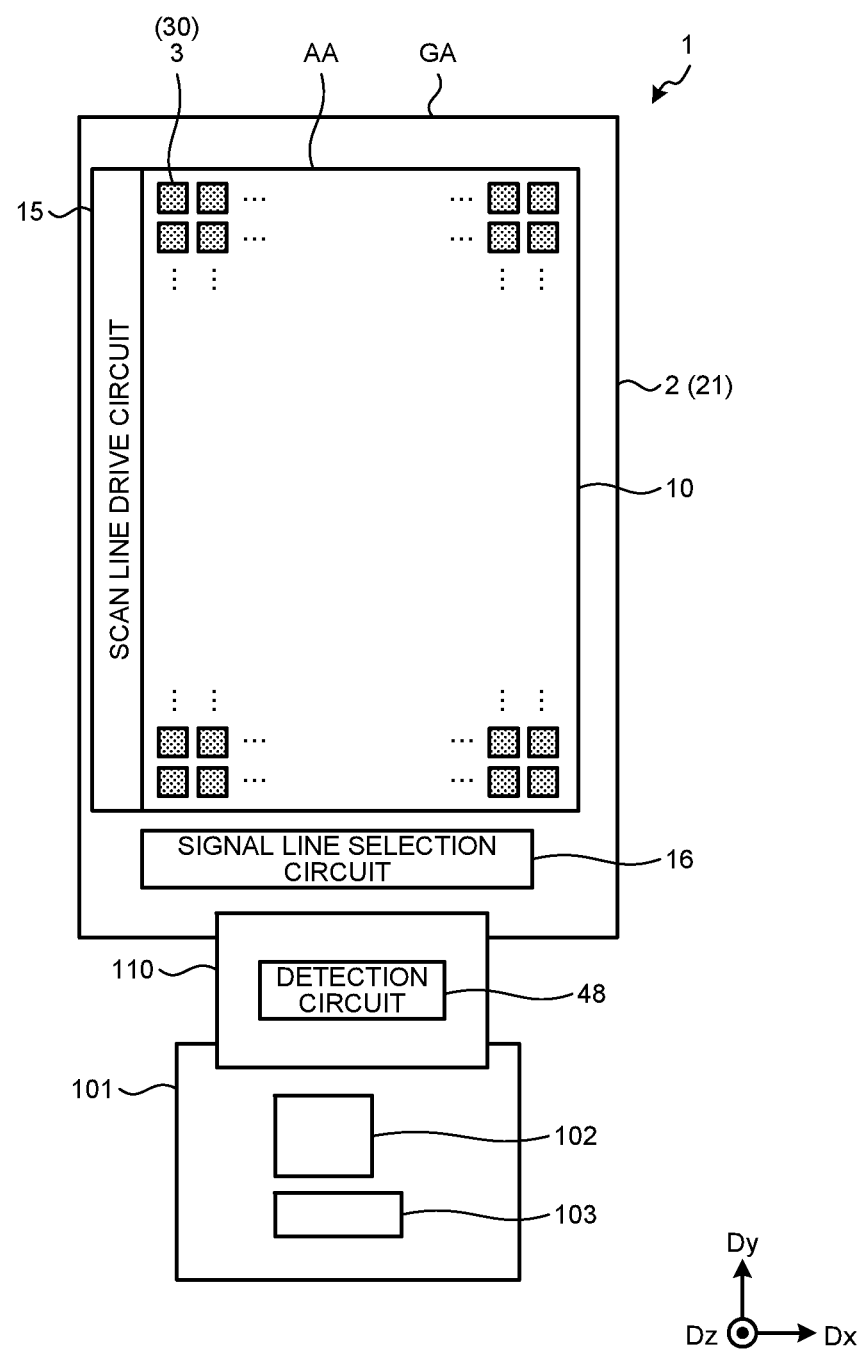
FIG. 2 is a plan view illustrating the detection device according to the first embodiment.

FIG. 2 is a plan view illustrating the detection device according to the first embodiment. As illustrated in FIG. 2, the detection device 1 includes an array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control a detection operation of the sensor 10. The power supply circuit 103 supplies voltage signals including, for example, a power supply potential VDD and a reference potential VCOM (refer to FIG. 4) to the sensor 10, the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21.

The substrate 21 has the detection region AA and a peripheral region GA. The detection region AA is a region provided with a plurality of detection elements 3 included in the sensor 10. The peripheral region GA is a region outside the detection region AA and is a region not provided with the detection elements 3. That is, the peripheral region GA is a region between the outer perimeter of the detection region AA and the outer edges of the substrate 21. The scan line drive circuit 15 and the signal line selection circuit 16 are provided in the peripheral region GA.

Each of the detection elements 3 of the sensor 10 is a photosensor including a photoelectric conversion element 30 as a sensor element. The photoelectric conversion element 30 is a photodiode and outputs an electric signal corresponding to light irradiating each of the photoelectric conversion elements 30. More specifically, the photoelectric conversion element 30 is a positive-intrinsic-negative (PIN) photodiode. The photoelectric conversion element 30 may be rephrased as an organic photo diode (OPD). The detection elements 3 are arranged in a matrix having a row-column configuration in the detection region AA. The photoelectric conversion element 30 included in the detection element 3 performs detection in accordance with gate drive signals (for example, a reset control signal RST and a read control signal RD) supplied from the scan line drive circuit 15. Each of the photoelectric conversion elements 30 outputs the electric signal corresponding to the light irradiating the photoelectric conversion element 30 as a detection signal Vdet to the signal line selection circuit 16. The detection device 1 detects the information on the living body based on the detection signals Vdet received from the photoelectric conversion elements 30.

The scan line drive circuit 15 and the signal line selection circuit 16 are provided in the peripheral region GA. Specifically, the scan line drive circuit 15 is provided in an area extending along a second direction Dy in the peripheral region GA. The signal line selection circuit 16 is provided in a region extending along a first direction Dx in the peripheral region GA and is provided between the sensor 10 and the detection circuit 48.

The first direction Dx is one direction in a plane parallel to the substrate 21. The second direction Dy is another direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy and is a direction normal to the substrate 21.

Figure 3:
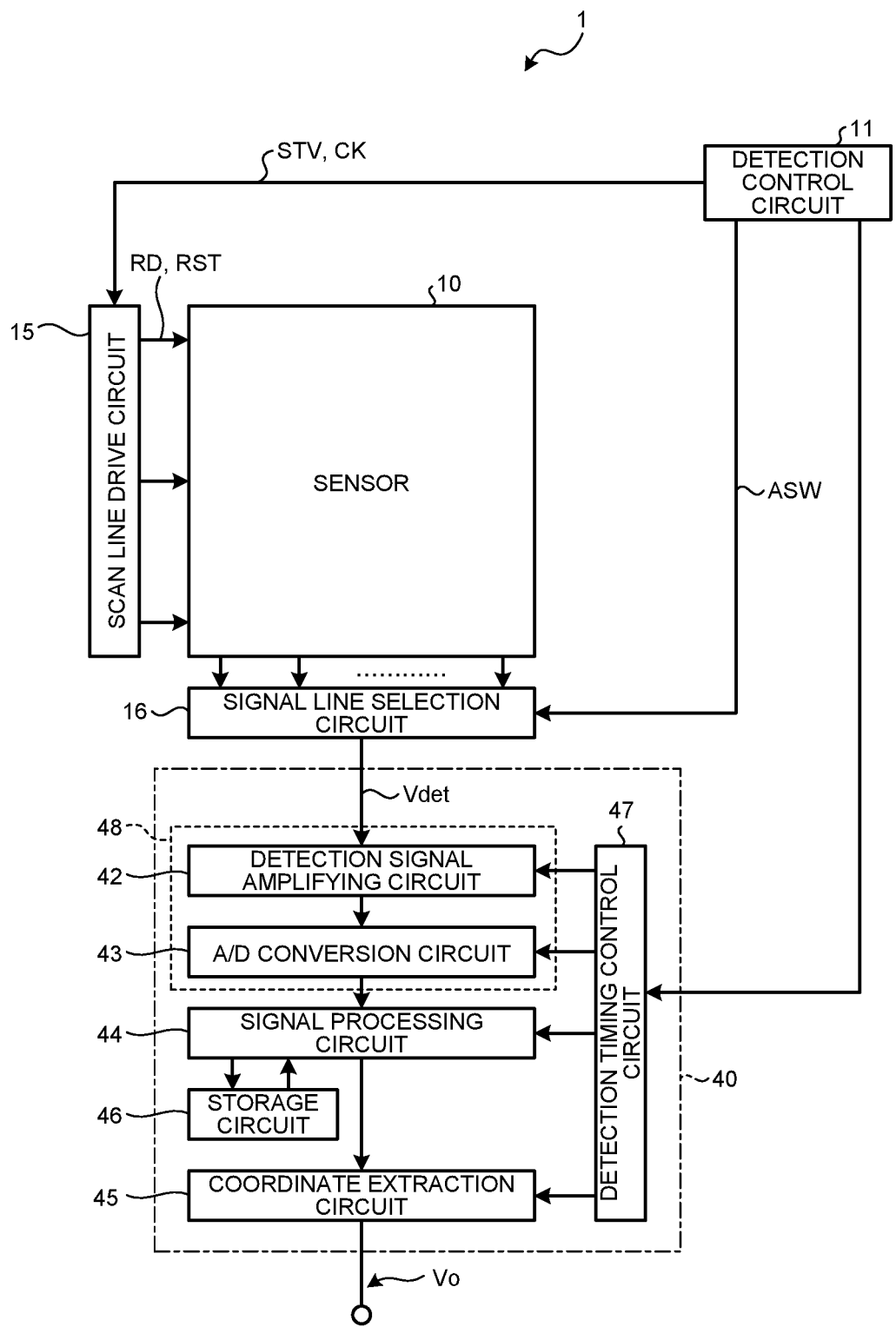
FIG. 3 is a block diagram illustrating a configuration example of the detection device according to the first embodiment.

FIG. 3 is a block diagram illustrating a configuration example of the detection device according to the first embodiment. As illustrated in FIG. 3, the detection device 1 further includes a detection control circuit 11 and a detector 40. One, some, or all of the functions of the detection control circuit 11 are included in the control circuit 102. One, some, or all of the functions of the detector 40 other than those of the detection circuit 48 are also included in the control circuit 102.

The detection control circuit 11 is a circuit that supplies respective control signals to the scan line drive circuit 15, the signal line selection circuit 16, and the detector 40 to control operations thereof. The detection control circuit 11 supplies various control signals such as a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (a read control scan line GLrd and a reset control scan line GLrst (refer to FIG. 4)) based on the various control signals. The scan line drive circuit 15 sequentially or simultaneously selects the scan lines and supplies the gate drive signals (for example, the reset control signals RST and the read control signals RD) to the selected scan lines. Through this operation, the scan line drive circuit 15 selects the photoelectric conversion elements 30 coupled to the scan lines.

Figure 4:
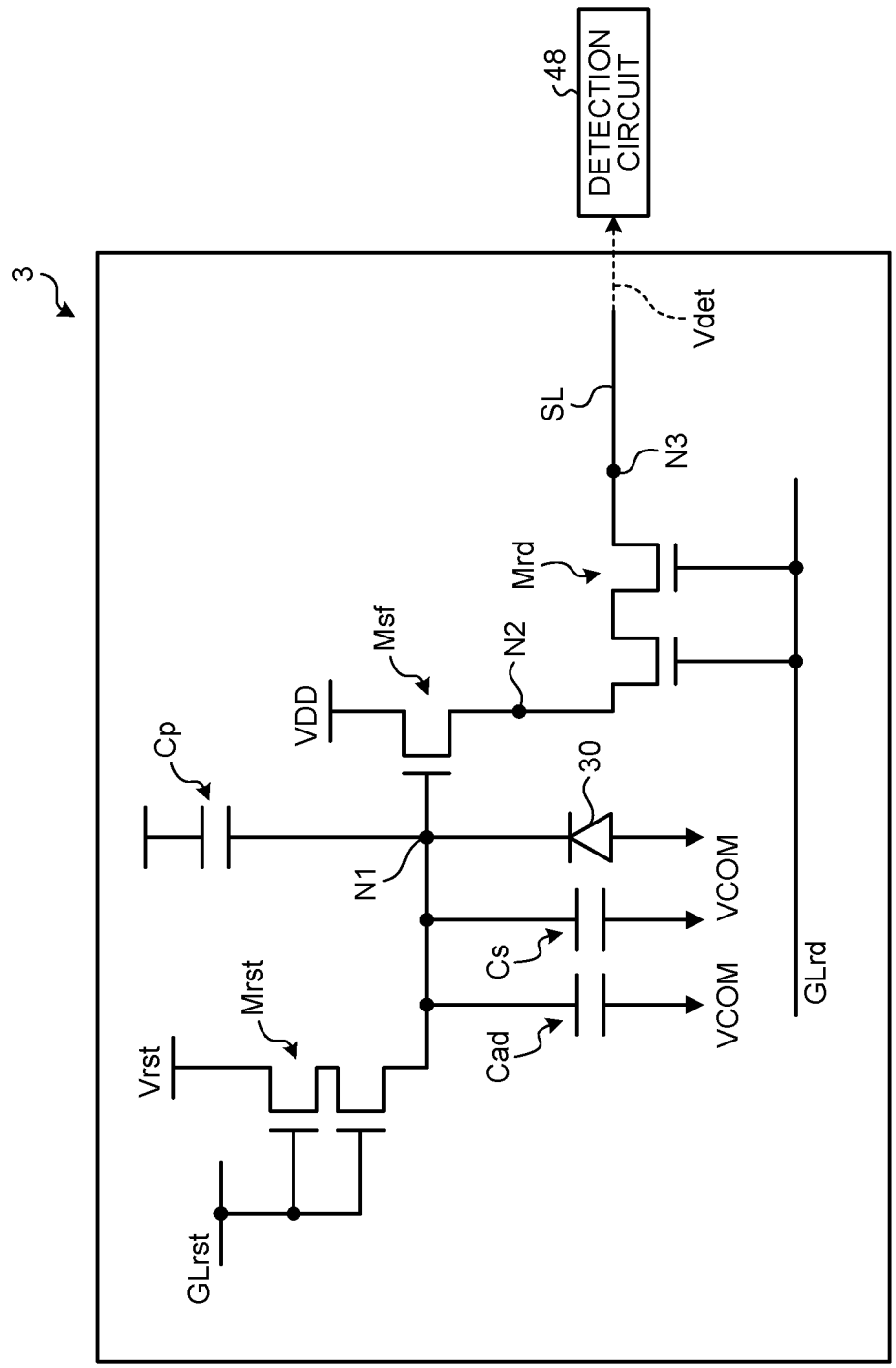
FIG. 4 is a circuit diagram illustrating a detection element.

The signal line selection circuit 16 is a switching circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signal Vdet of the photoelectric conversion element 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet and is, for example, an integration circuit. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image, a pulse wave, pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, each of the detection elements 3 includes the photoelectric conversion element 30, a reset transistor Mrst, a read transistor Mrd, and a source follower transistor Msf. The detection element 3 is provided with the reset control scan line GLrst and the read control scan line GLrd as detection drive lines (scan lines) and is provided with a corresponding one of the output signal lines SL as wiring for reading a signal.

While FIG. 4 illustrates one of the detection elements 3, the reset control scan line GLrst, the read control scan line GLrd, and the output signal line SL are each coupled to a plurality of the detection elements 3. Specifically, the reset control scan line GLrst and the read control scan line GLrd extend in the first direction Dx (refer to FIG. 2) and are coupled to the detection elements 3 arranged in the first direction Dx. The output signal line SL extends in the second direction Dy and is coupled to the detection elements 3 arranged in the second direction Dy.

The reset transistor Mrst, the read transistor Mrd, and the source follower transistor Msf are provided correspondingly to each of the photoelectric conversion elements 30. Each of the transistors included in the detection element 3 is fabricated from an n-type thin-film transistor (TFT). However, each of the transistors is not limited thereto and may be fabricated from a p-type TFT.

The reference potential VCOM is applied to the anode of the photoelectric conversion element 30. The cathode of the photoelectric conversion element 30 is coupled to a node N1. The node N1 is coupled to a capacitor Cs, a capacitor Cad, one of the source and the drain of the reset transistor Mrst, and the gate of the source follower transistor Msf. In addition, the node N1 has parasitic capacitance Cp. One end of each of the capacitors Cs and Cad is coupled to the node N1, and the other end thereof is coupled to the reference potential VCOM. When light irradiates the photoelectric conversion element 30, a signal (electric charge) output from the photoelectric conversion element 30 is stored in the capacitors Cs and Cad. The capacitor Cs is, for example, a capacitor formed between an upper electrode 34 and a lower electrode 35 coupled to the photoelectric conversion element 30 (refer to FIG. 7). The capacitor Cad is a capacitor added to the capacitor Cs and is a capacitor formed between a first electrode 81 and a second electrode 82 provided in the array substrate 2 (refer to FIG. 7).

The gates of the reset transistor Mrst are coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photoelectric conversion element 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with the signal (electric charge) generated by the photoelectric conversion element 30. This operation causes the source follower transistor Msf to output a signal (voltage) corresponding to the signal (electric charge) generated by the photoelectric conversion element 30 to the read transistor Mrd.

The read transistor Mrd is coupled between the source of the source follower transistor Msf (node N2) and the output signal line SL (node N3). The gate of the read transistor Mrd is coupled to the read control scan line GLrd. When the read transistor Mrd is turned on in response to the read control signal RD, the signal output from the source follower transistor Msf, that is, the signal voltage corresponding to the signal (electric charge) generated by the photoelectric conversion element 30 is output as the detection signal Vdet to the output signal line SL.

In the present embodiment, the capacitor Cad is added in addition to the capacitor Cs. Therefore, the potential of the node N1 can be restrained from decreasing during an exposure period between a reset period (period in which the potential of the node N1 is reset to the reset potential Vrst) and a read period (period in which the read transistor is on). This configuration reduces a variation in the potential of the node N1, and consequently, reduces a variation in the signal (voltage) output from the source follower transistor Msf.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure and may have a single-gate structure or a structure configured by coupling three or more transistors in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 5:
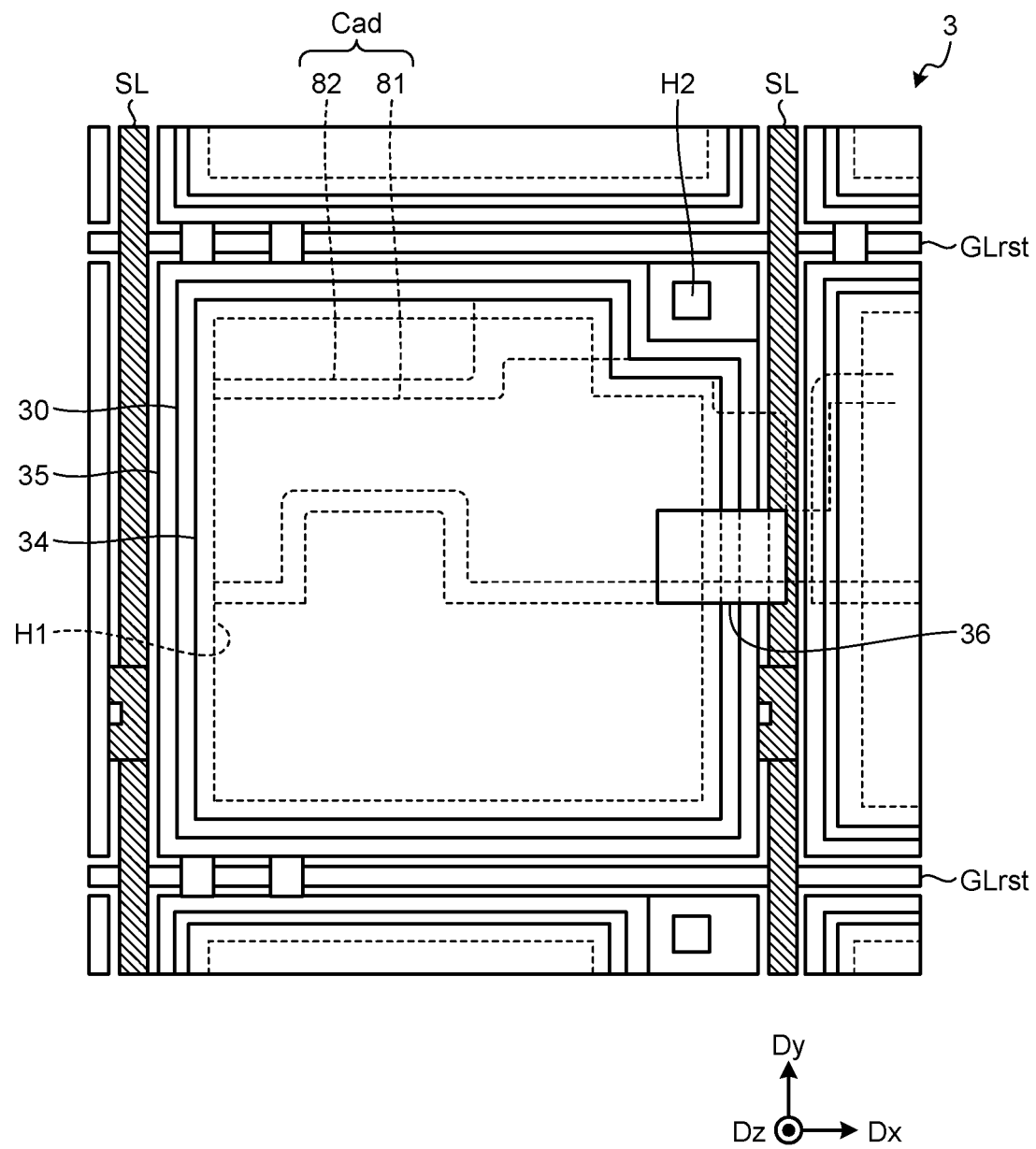
FIG. 5 is a plan view illustrating the detection element.

The following describes a planar configuration and a sectional configuration of the detection element 3. FIG. 5 is a plan view illustrating the detection element. As illustrated in FIG. 5, each of the detection elements 3 is formed in a region surrounded by two of the reset control scan lines GLrst and two of the output signal lines SL.

The reset control scan lines GLrst extend in the first direction Dx and are arranged in the second direction Dy. The output signal lines SL extend in the second direction Dy and are arranged in the first direction Dx.

The photoelectric conversion element 30 is provided in a region surrounded by two of the reset control scan lines GLrst adjacent in the second direction Dy and two of the output signal lines SL adjacent in the first direction Dx. The upper electrode 34 faces the lower electrode 35 with the photoelectric conversion element 30 interposed therebetween in the third direction Dz. Specifically, the photoelectric conversion element 30 is disposed above the array substrate 2 provided with various types of wiring and various transistors with the lower electrode 35 interposed therebetween.

The lower electrode 35 has a larger area than that of each of the photoelectric conversion element 30 and the upper electrode 34. The lower electrode 35 is electrically coupled, at a portion thereof overlapping neither the photoelectric conversion element 30 nor the upper electrode 34, to the reset transistor Mrst and the source follower transistor Msf through a contact hole H2. The upper electrode 34 is provided so as to cover the photoelectric conversion element 30 and is electrically coupled to the photoelectric conversion element 30 through a contact hole H1. The upper electrode 34 is coupled to a reference potential supply line through coupling wiring 36 and supplies the reference potential VCOM to the photoelectric conversion element 30. The reference potential supply line is not illustrated, but is provided, for example, so as to extend in the second direction Dy while overlapping the output signal line SL.

The first and the second electrodes 81 and 82 are provided in a region overlapping the photoelectric conversion element 30. The capacitor Cad is formed between the first and the second electrodes 81 and 82. A detailed configuration of the photoelectric conversion element 30 and the first and the second electrodes 81 and 82 will be described later.

Figure 6:
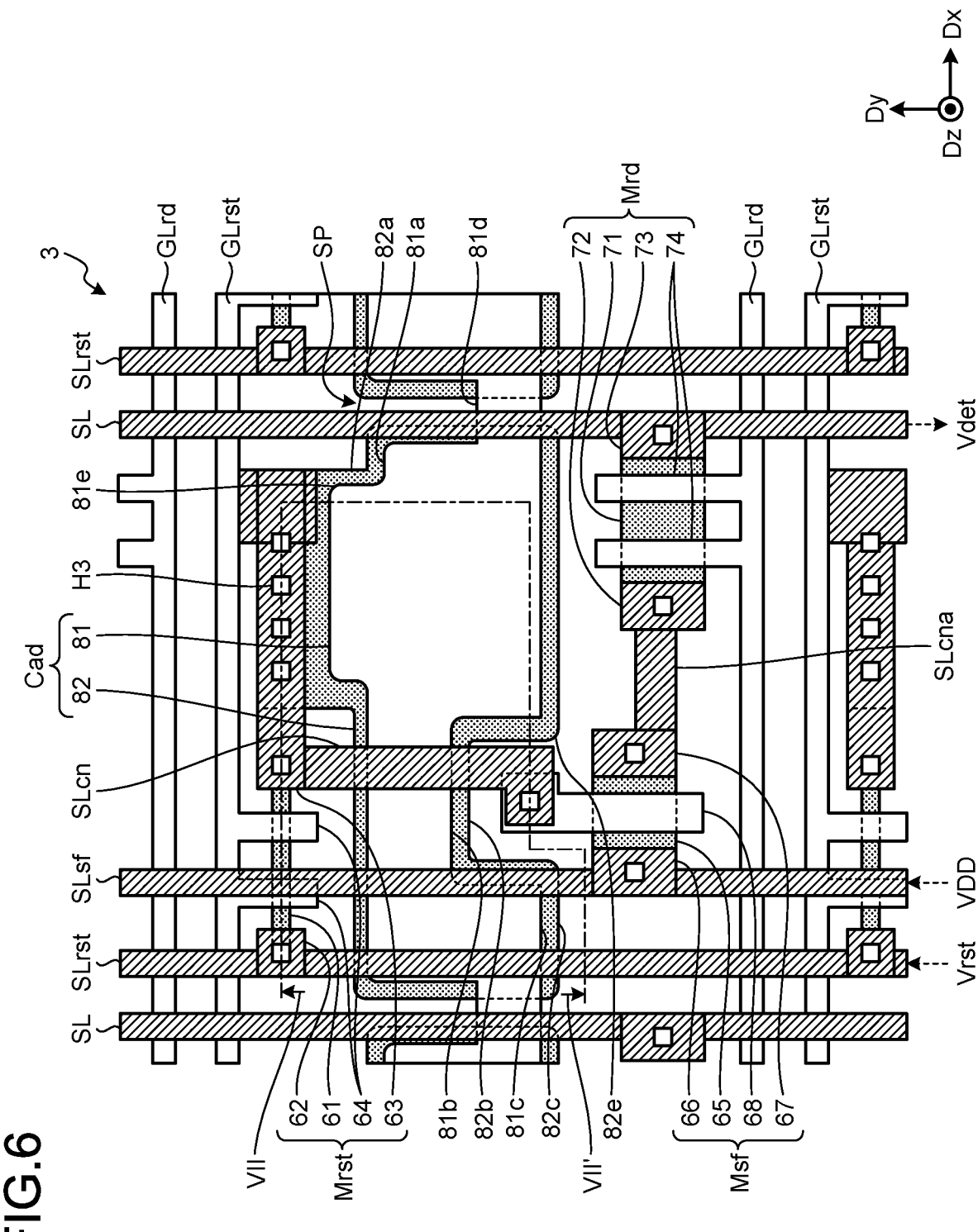
FIG. 6 is a plan view of an array substrate on which the detection element is formed.

FIG. 6 is a plan view of the array substrate on which the detection element is formed. FIG. 6 is a plan view schematically illustrating a portion of the detection element 3, that is, a portion thereof except members on the upper side of the photoelectric conversion element 30.

As illustrated in FIG. 6, the detection element 3 further includes the read control scan line GLrd and two signal lines (power supply signal line SLsf and reset signal line SLrst). The read control scan line GLrd extends in the first direction Dx, and the read control scan line GLrd and the reset control scan line GLrst are arranged in the second direction Dy. In each of the detection elements 3, the photoelectric conversion element 30, the transistors, and the capacitor Cad are provided between the reset control scan line GLrst and the read control scan line GLrd that are adjacent in the second direction Dy. Each of the power supply signal line SLsf and the reset signal line SLrst extends in the second direction Dy. The power supply signal line SLsf, the reset signal line SLrst, and the output signal line SL are arranged in the first direction Dx.

The photoelectric conversion element 30 illustrated in FIG. 5 is disposed on the array substrate 2 provided with the various types of wiring and the various transistors, is provided so as to overlap at least a portion of the various transistors, and is also provided in a region overlapping at least a portion of the power supply signal line SLsf, the reset signal line SLrst, and the read control scan line GLrd.

As illustrated in FIG. 6, the reset transistor Mrst includes a semiconductor layer 61, a source electrode 62, a drain electrode 63, and gate electrodes 64. One end of the semiconductor layer 61 is coupled to the reset signal line SLrst. The other end of the semiconductor layer 61 is coupled to coupling wiring SLcn. A portion of the reset signal line SLrst coupled to the semiconductor layer 61 serves as the source electrode 62, and a portion of the coupling wiring SLcn coupled to the semiconductor layer 61 serves as the drain electrode 63. The gate electrodes 64 face the semiconductor layer 61. More specifically, the reset control scan line GLrst is provided with two branches branching in the second direction Dy, and the semiconductor layer 61 intersects the two branches of the reset control scan line GLrst. The two branches are provided adjacent to each other in the first direction Dx. Portions of the two branches of the reset control scan line GLrst that overlap the semiconductor layer 61 serve as the gate electrodes 64. Channel regions are formed at portions of the semiconductor layer 61 overlapping the two branches of the reset control scan line GLrst.

The coupling wiring SLcn is formed in an inverted L-shape and includes a portion extending in the first direction Dx and a portion extending in the second direction Dy. An end of the portion of the coupling wiring SLcn extending in the first direction Dx is coupled to the cathode (n-type semiconductor layer 33) of the photoelectric conversion element 30 through the contact hole H2 (refer to FIG. 5). The reset transistor Mrst is coupled to the gate of the source follower transistor Msf through the portion of the coupling wiring SLcn extending in the second direction Dy. That is, the coupling wiring SLcn corresponds to the node N1 in FIG. 4.

The source follower transistor Msf includes a semiconductor layer 65, a source electrode 67, a drain electrode 66, and a gate electrode 68. One end of the semiconductor layer 65 is coupled to the power supply signal line SLsf. The other end of the semiconductor layer 65 is coupled to the read transistor Mrd through coupling wiring SLcna. A portion of the power supply signal line SLsf coupled to the semiconductor layer 65 serves as the drain electrode 66, and a portion of the coupling wiring SLcna coupled to the semiconductor layer 65 serves as the source electrode 67.

One end of the gate electrode 68 is coupled to the coupling wiring SLcn through a contact hole. The semiconductor layer 65 intersects the gate electrode 68. A channel region is formed at a portion of the semiconductor layer 65 intersecting the gate electrode 68.

The above-described configuration electrically couples the cathode (n-type semiconductor layer 33) of the photoelectric conversion element 30 to the reset transistor Mrst and the source follower transistor Msf through the coupling wiring SLcn.

The read transistor Mrd includes a semiconductor layer 71, a source electrode 73, a drain electrode 72, and gate electrodes 74. One end of the semiconductor layer 71 is coupled to the source follower transistor Msf through the coupling wiring SLcna. The other end of the semiconductor layer 71 is coupled to the output signal line SL. A portion of the output signal line SL coupled to the semiconductor layer 71 serves as the source electrode 73. A portion of the coupling wiring SLcna coupled to the semiconductor layer 71 serves as the drain electrode 72. Two branches extending in the second direction Dy are coupled to the read control scan line GLrd. The two branches are provided adjacent to each other in the first direction Dx. The semiconductor layer 71 intersects the two branches branching from the read control scan line GLrd. The two branches of the read control scan line GLrd serve as the gate electrodes 74. The above-described configuration couples the source follower transistor Msf and the read transistor Mrd to the output signal line SL.

The first and the second electrodes 81 and 82 are provided in a region in a plan view that overlaps the photoelectric conversion element 30 and overlaps none of the reset transistor Mrst, the source follower transistor Msf, and the read transistor Mrd. The first electrode 81 includes a main part 81a, a coupling part 81b, a sub-part 81c, and a coupling part 81d. The second electrode 82 includes a main part 82a, a coupling part 82b, and a sub-part 82c. The main part 81a, the coupling part 81b, and the sub-part 81c are provided so as to overlap the main part 82a, the coupling part 82b, and the sub-part 82c, respectively.

The main parts 81a and 82a are respectively formed so as to have the largest areas among those of the parts constituting the first and the second electrodes 81 and 82 and are provided in a region surrounded by the output signal line SL, the coupling wiring SLcn, the source follower transistor Msf, and the read transistor Mrd. The second electrode 82 is coupled, at an end on the second direction Dy side of the main part 82a, to a portion of the coupling wiring SLcn extending in the first direction Dx through four contact holes H3. This configuration electrically couples the second electrode 82 through the coupling wiring SLcn (node N1) to the cathode of the photoelectric conversion element 30, the reset transistor Mrst, and the gate of the source follower transistor Msf.

The coupling parts 81b and 82b are provided so as to intersect the portion of the coupling wiring SLcn extending in the second direction Dy. The coupling part 81b couples together the main part 81a and the sub-part 81c adjacent to each other in the first direction Dx. The coupling part 82b couples together the main part 82a and the sub-part 82c adjacent to each other in the first direction Dx. Widths of the coupling parts 81b and 82b in the second direction Dy are less than those of the main parts 81a and 82a in the second direction Dy.

The sub-parts 81c and 82c are provided between the reset signal line SLrst and the power supply signal line SLsf. Widths of the sub-parts 81c and 82c in the second direction Dy are greater than those of the coupling parts 81b and 82b in the second direction Dy.

The coupling part 81d couples together the main part 81a and the sub-part 81c of the respective detection elements 3 adjacent in the first direction Dx. In other words, the first electrode 81 extends in the first direction Dx so as to overlap the detection elements 3 arranged in the first direction Dx. The first electrode 81 is coupled to the reference potential VCOM at any location. The second electrode 82 is separately provided for each of the detection elements 3. That is, the first and the second electrodes 81 and 82 overlap the photoelectric conversion element 30 in the plan view. The first electrode 81 has the main parts 81a that overlap the respective photoelectric conversion elements 30 and the coupling parts 81d each of which couples adjacent main parts 81a of the main parts 81a. The second electrode 82 is formed to have an island pattern for each of the photoelectric conversion elements 30.

With the above-described configuration, the first and the second electrodes 81 and 82 form a capacitor between the main parts 81a and 82a facing each other, and further form capacitors between the coupling parts 81b and 82b facing each other and between the sub-parts 81c and 82c facing each other, thus forming the large capacitor Cad as a whole. However, the first and the second electrodes 81 and 82 are not limited to this configuration and need not have the coupling parts 81b and 82b and the sub-parts 81c and 82c.

The first and the second electrodes 81 and 82 have chamfers 81e and 82e obtained by chamfering corners. That is, no sharp portion is formed at ends of the first and the second electrodes 81 and 82. Therefore, concentration of electric fields at the ends of the first and the second electrodes 81 and 82 can be more reduced than a case where the corners of the first and the second electrodes 81 and 82 are formed to have right angles. As a result, generation of an electrostatic discharge (ESD) can be reduced in the manufacturing process of the array substrate 2 of the detection device 1.

The planar configuration of the photoelectric conversion element 30, the capacitor Cad, and the transistors illustrated in FIGS. 5 and 6 is merely an example and can be changed as appropriate. For example, the arrangement of the transistors may be changed. For example, although the semiconductor layer 65 and the semiconductor layer 71 are separately disposed in the present embodiment, the present disclosure is not limited thereto. The source follower transistor Msf and the read transistor Mrd may be formed of one common semiconductor layer.

The arrangement of the first and the second electrodes 81 and 82 may be changed as appropriate depending on the arrangement of the transistors. In FIGS. 5 and 6, the second electrode 82 is provided to have a larger area than that of the first electrode 81, and the second electrode 82 is disposed such that the outer periphery of the second electrode 82 surrounds the periphery of the first electrode 81. However, the present disclosure is not limited to this arrangement. The relation between the areas of the second electrode 82 and the first electrode 81 may be reversed, or the areas may be the same as each other.

Figure 7:
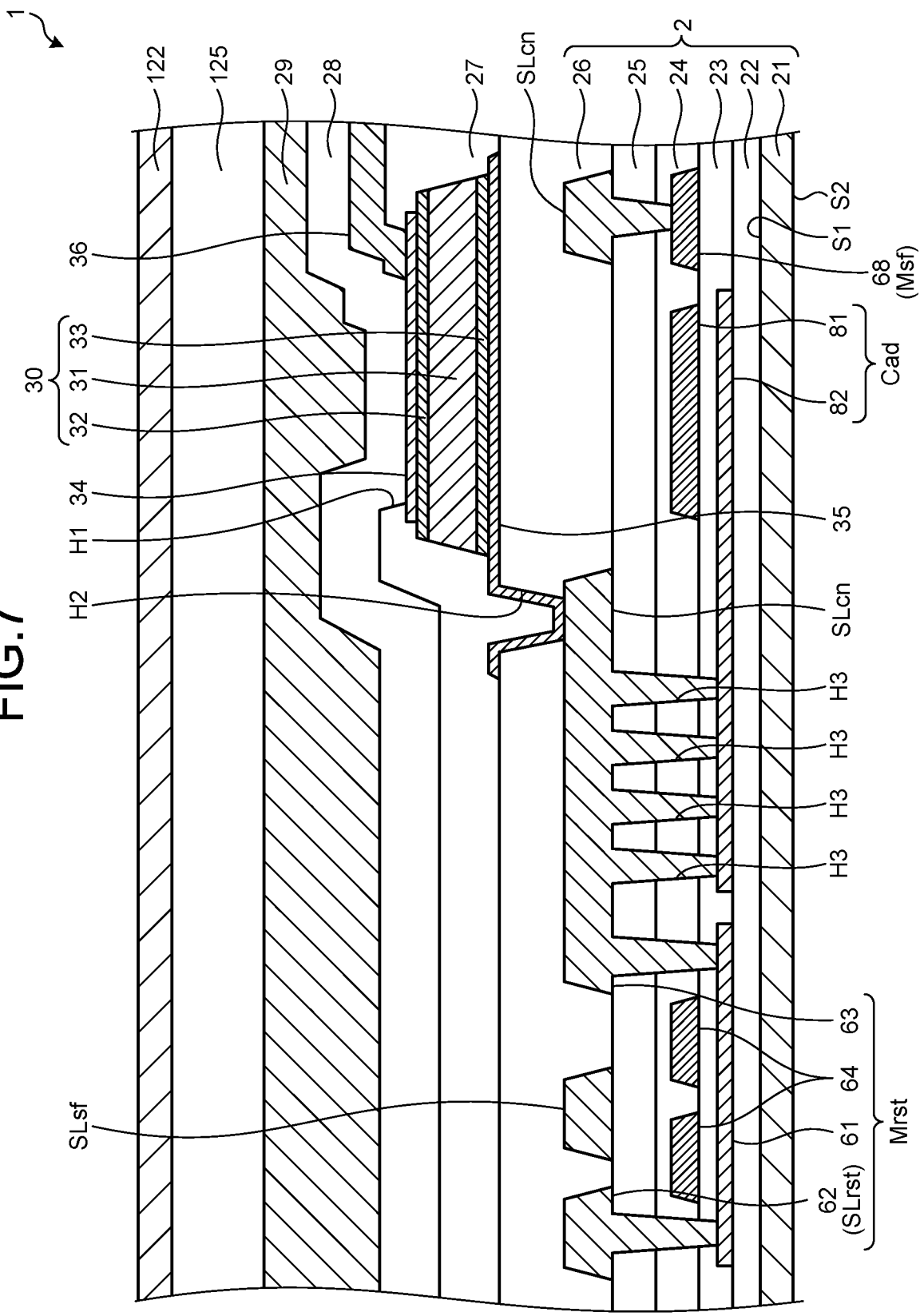
FIG. 7 is a VII-VII' sectional view of FIG. 6.

FIG. 7 is a VII-VII' sectional view of FIG. 6. While FIG. 7 illustrates a sectional configuration of the reset transistor Mrst among the three transistors included in the detection element 3, each of the source follower transistor Msf and the read transistor Mrd also has a sectional configuration similar to that of the reset transistor Mrst.

The substrate 21 is an insulating substrate, and a glass substrate of, for example, quartz or alkali-free glass is used as the substrate 21. The substrate 21 has a first principal surface S1 and a second principal surface S2 on the opposite side of the first principal surface S1. The various transistors including the reset transistor Mrst, the various types of wiring (scan lines and signal lines), the first electrode 81, the second electrode 82, and insulating films are provided on the first principal surface S1 of the substrate 21 to form the array substrate 2. The photoelectric conversion elements 30 are arranged on the array substrate 2, that is, on the first principal surface S1 side of the substrate 21.

An undercoat film 22 is provided on the first principal surface S1 of the substrate 21. The undercoat film 22, insulating films 23, 24, and 25, and insulating films 27 and 28 are inorganic insulating films and are formed of, for example, silicon oxide ($SiO_2$) or silicon nitride (SiN).

In the sectional configuration of the reset transistor Mrst, the semiconductor layer 61 is provided on the undercoat film 22. For example, polysilicon is used as the semiconductor layer 61. The semiconductor layer 61 is, however, not limited thereto, and may be formed of, for example, a microcrystalline oxide semiconductor, an amorphous oxide semiconductor, or low-temperature polycrystalline silicon (LTPS).

The insulating film 23 is provided on the undercoat film 22 so as to cover the semiconductor layer 61. The gate electrodes 64 are provided on the insulating film 23. The gate electrode 68 of the source follower transistor Msf is also provided in the same layer as that of the gate electrodes 64 on the insulating film 23. The insulating film 23 is a gate insulting film. Tetraethyl orthosilicate (TEOS) can be used as a material of the insulating film 23. The reset control scan line GLrst and the read control scan line GLrd (refer to FIG. 6) are also provided in the same layer as that of the gate electrodes 64. The insulating film 24 is provided on the insulating film 23 so as to cover the gate electrodes 64 and 68.

The reset transistor Mrst has a top-gate structure in which the gate electrodes 64 are provided on the upper side of the semiconductor layer 61, but may have a bottom-gate structure in which the gate electrodes 64 are provided on the lower side of the semiconductor layer 61, or a dual-gate structure in which the gate electrodes 64 are provided on the upper side and lower side of the semiconductor layer 61.

The insulating films 24 and 25 are provided on the insulating film 23 so as to cover the gate electrodes 64. The source electrode 62 and the drain electrode 63 are provided on the insulating film 25. The source electrode 62 and the drain electrode 63 are coupled to the semiconductor layer 61 through contact holes passing through the insulating films 23, 24, and 25. The source electrode 62 and the drain electrode 63 are formed of, for example, a multilayered film of Ti—Al—Ti layers or Ti—Al layers that has a multilayered structure of titanium and aluminum.

The various signal lines (the output signal line SL (refer to FIG. 5), the power supply signal line SLsf, and the reset signal line SLrst) and the coupling wiring SLcn are provided in the same layer as that of the source electrode 62 and the drain electrode 63. The coupling wiring SLcn is coupled to the gate electrode 68 of the source follower transistor Msf through a contact hole passing through the insulating films 24 and 25.

The first and the second electrodes 81 and 82 forming the capacitor Cad are provided using two of the layers constituting the transistors (for example, the reset transistor Mrst). In the present embodiment, the first and the second electrodes 81 and 82 are provided between the substrate 21 and the photoelectric conversion element 30 in the third direction Dz. The second electrode 82 is provided on the undercoat film 22 and faces the first electrode 81 with the insulating film 23 interposed therebetween in the third direction Dz. The first electrode 81 is located in the same layer as that of the gate electrodes 64 and is formed of the same material as that of the gate electrodes 64. The second electrode 82 is located in the same layer as that of the semiconductor layer 61 and is formed of the same material as that of the semiconductor layer 61. The second electrode 82 has a larger area than that of the first electrode 81 and extends to a region overlapping the coupling wiring SLcn. The second electrode 82 is coupled to the coupling wiring SLcn through four contact holes H3 passing through the insulating films 23, 24, and 25.

Since the first and the second electrodes 81 and 82 are provided in the same layers as those of the reset transistor Mrst, the manufacturing process is simpler and the detection device 1 (array substrate 2) can be thinner than in a configuration in which the capacitor Cad is formed in a layer different from those of the reset transistor Mrst.

An insulating film 26 is provided above the insulating film 25 so as to cover the various transistors, such as the reset transistor Mrst, and the capacitor Cad. The insulating film 26 is an organic insulating film of an organic material such as a photosensitive acrylic resin. The insulating film 26 is thicker than the insulating film 25. The insulating film 26 has a better step covering property than that of inorganic insulating materials and can planarize steps formed by the various transistors and the various types of wiring.

The following describes a sectional configuration of the photoelectric conversion element 30. The photoelectric conversion element 30 is provided on the upper side of the insulating film 26. Specifically, the lower electrode 35 is provided on the upper side of the insulating film 26 and is electrically coupled to the coupling wiring SLcn through the contact hole H2. The photoelectric conversion element 30 is coupled to the lower electrode 35. The lower electrode 35 can employ, for example, a multilayered structure of titanium (Ti) and titanium nitride (TiN). Since the lower electrode 35 is provided between the substrate 21 and the photoelectric conversion element 30, the lower electrode 35 serves as a light-blocking layer and can restrain light from entering the photoelectric conversion element 30 from the second principal surface S2 side of the substrate 21.

The photoelectric conversion element 30 includes a semiconductor layer having a photovoltaic effect. Specifically, the semiconductor layer of the photoelectric conversion element 30 includes an i-type semiconductor layer 31, a p-type semiconductor layer 32, and the n-type semiconductor layer 33. The i-type semiconductor layer 31, the p-type semiconductor layer 32, and the n-type semiconductor layer 33 are formed of, for example, amorphous silicon (a-Si). The material of the semiconductor layers is not limited thereto and may be, for example, polysilicon or microcrystalline silicon.

The a-Si of the p-type semiconductor layer 32 is doped with impurities to form a p+ region. The a-Si of the n-type semiconductor layer 33 is doped with impurities to form an n+ region. The i-type semiconductor layer 31 is, for example, a non-doped intrinsic semiconductor and has lower conductivity than that of the p-type semiconductor layer 32 and the n-type semiconductor layer 33.

The i-type semiconductor layer 31 is provided between the n-type semiconductor layer 33 and the p-type semiconductor layer 32 in a direction orthogonal to a surface of the substrate 21 (in the third direction Dz). In the present embodiment, the n-type semiconductor layer 33, the i-type semiconductor layer 31, and the p-type semiconductor layer 32 are stacked in this order on the lower electrode 35.

This configuration electrically couples the n-type semiconductor layer 33 of the photoelectric conversion element 30 to the reset transistor Mrst and the source follower transistor Msf through the lower electrode 35 and the coupling wiring SLcn.

The upper electrode 34 is provided on the p-type semiconductor layer 32. The upper electrode 34 is formed of, for example, a light-transmitting conductive material such as indium tin oxide (ITO). The insulating film 27 is provided on the insulating film 26 so as to cover the photoelectric conversion element 30 and the upper electrode 34. The insulating film 27 is provided with the contact hole H1 in a region overlapping the upper electrode 34.

The coupling wiring 36 is provided on the insulating film 27 and is electrically coupled to the upper electrode 34 through the contact hole H1. The p-type semiconductor layer 32 is supplied with the reference potential VCOM (refer to FIG. 4) through the coupling wiring 36.

The photoelectric conversion element 30 is provided on the upper side of the insulating film 26, that is, on the upper side of the transistors and the capacitor Cad. In other words, the first and the second electrodes 81 and 82 constituting the capacitor Cad are less restricted by the arrangement, shape, and the like of the photoelectric conversion element 30, and therefore, can be formed to have large areas using regions not overlapping the transistors. As a result, the capacitor Cad can have a large capacitance value.

The insulating film 28 is provided on the insulating film 27 so as to cover the upper electrode 34 and the coupling wiring 36. The insulating film 28 is provided as a protective layer for restraining water from entering the photoelectric conversion element 30. In addition, an insulating film 29 is provided on the insulating film 28 so as to cover the photoelectric conversion elements 30. The insulating film 29 is a hard coat film formed of an organic material. The insulating film 29 planarizes steps on a surface of the insulating film 28 formed by the photoelectric conversion elements 30 and the coupling wiring 36.

The cover member 122 is provided so as to cover the various transistors and the photoelectric conversion elements 30 with the adhesive layer 125 interposed therebetween. The adhesive layer 125 bonds the insulating film 29 to the cover member 122. The adhesive layer 125 is, for example, a light-transmitting optically clear adhesive (OCA) sheet.

As described above, the detection device 1 of the present embodiment includes the substrate 21, the photoelectric conversion elements 30 arranged on the substrate 21, the transistors (the source follower transistors Msf, the reset transistors Mrst, and the read transistors Mrd) that each include the semiconductor layer and the gate electrode facing the semiconductor layer and are provided for each of the photoelectric conversion elements 30, and the first and the second electrodes 81 and 82 that are provided between the substrate 21 and the photoelectric conversion elements 30 in the direction orthogonal to the substrate 21 and face each other with the insulating film 23 interposed therebetween. The first electrode 81 is located in the same layer as that of the gate electrode 64, and the second electrode 82 is located in the same layer as that of the semiconductor layer 61.

With this configuration, the capacitor Cad is formed between the first electrode 81 and the second electrode 82. Therefore, the potential of the node N1 (the cathode of the photoelectric conversion element 30, the gate of the source follower transistor Msf, and the source or the drain of the reset transistor Mrst) is restrained from decreasing during the exposure period. As a result, the detection device 1 can reduce the variation in the signal that is output from the source follower transistor Msf. Since the first and the second electrodes 81 and 82 are formed in the same layer as that of the transistors, the detection device 1 (array substrate 2) can be thinner than in a configuration in which the first and the second electrodes 81 and 82 are provided in a layer different from that of the transistors.

Second Embodiment

Figure 8:
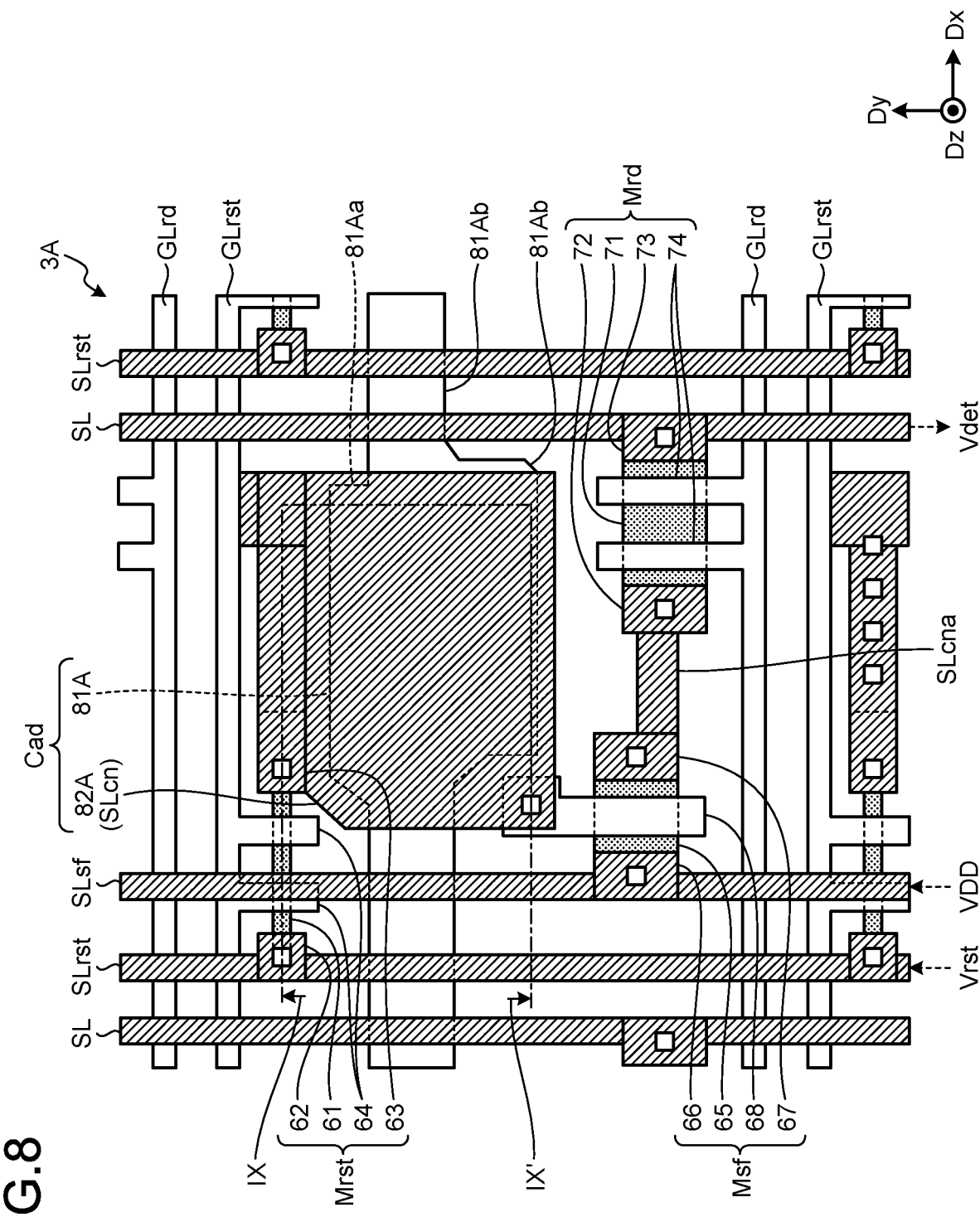
FIG. 8 is a plan view of the array substrate on which a detection element according to a second embodiment is formed.

FIG. 8 is a plan view of the array substrate on which a detection element according to a second embodiment is formed. In the following description, the same components as those described in the above-described embodiment are denoted by the same reference numerals, and the repetitive explanation thereof will not be omitted.

As illustrated in FIG. 8, a detection element 3A of the second embodiment has a different configuration of a first electrode 81A and a second electrode 82A constituting the capacitor Cad, from that in the first embodiment described above. Specifically, the first electrode 81A includes main parts 81Aa and coupling parts 81Ab. The main part 81Aa is provided in a region surrounded by the output signal line SL, the power supply signal line SLsf, the reset control scan line GLrst, the source follower transistor Msf, and the read transistor Mrd. The coupling part 81Ab extends in the first direction Dx so as to intersect the signal lines and couples together the main parts 81Aa adjacent in the first direction Dx.

The second electrode 82A is provided so as to overlap the main parts 81Aa of the first electrode 81A. The second electrode 82A also serves as the coupling wiring SLcn. That is, one end of the second electrode 82A in the second direction Dy is coupled to the semiconductor layer 61 of the reset transistor Mrst. One end of the second electrode 82A in the second direction Dy is electrically coupled to the cathode of the photoelectric conversion element 30 through the contact hole H2 (refer to FIG. 5). In addition, the other end of the second electrode 82A in the second direction Dy is electrically coupled to the gate electrode 68 of the source follower transistor Msf.

Also in the second embodiment, the first electrode 81A is coupled to the reference potential VCOM. The second electrode 82A serves as the node N1. The first electrode 81A is provided with a chamfer 81Ae. A chamfer may also be formed on the second electrode 82A.

Figure 9:
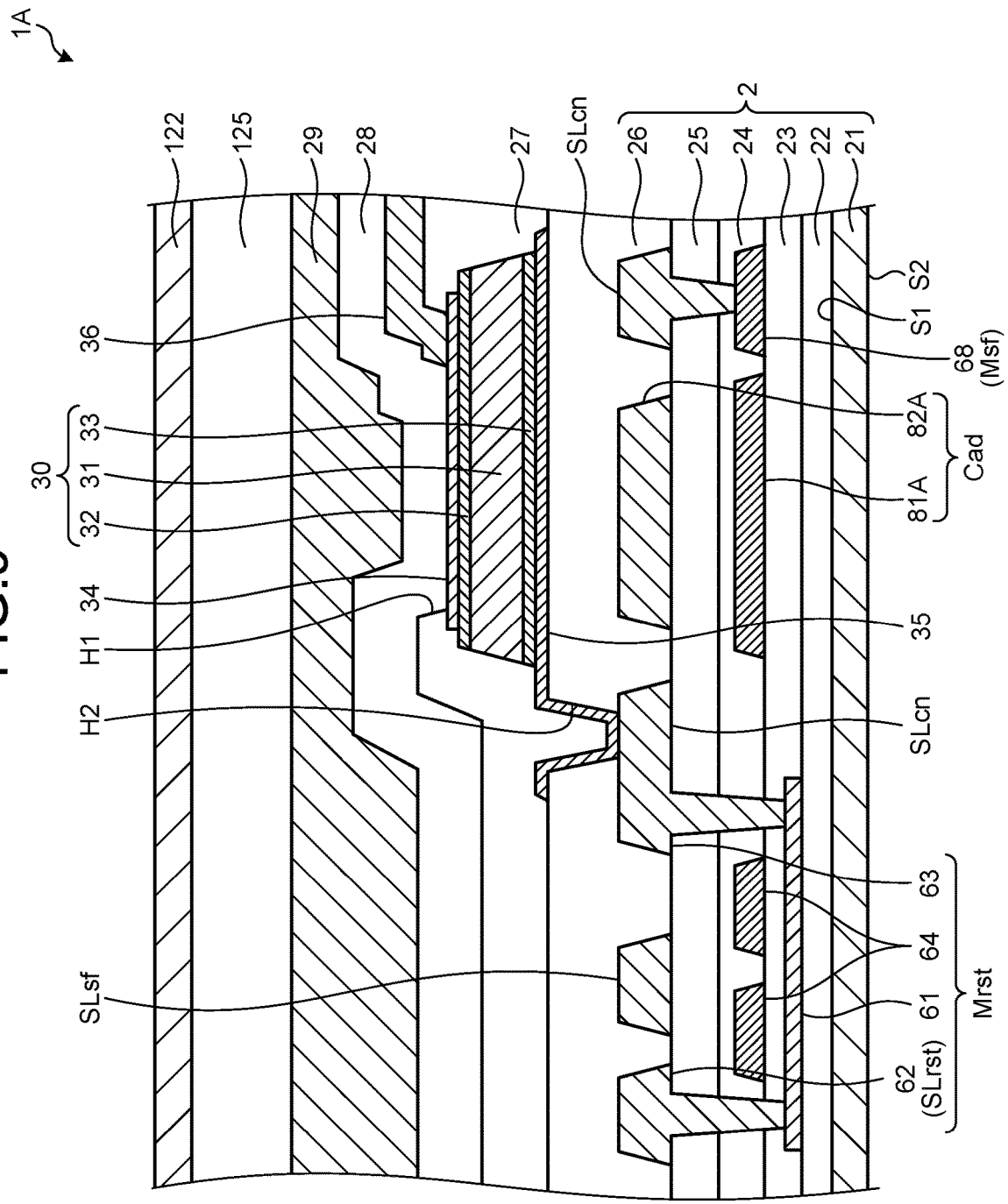
FIG. 9 is a IX-IX' sectional view of FIG. 8.

FIG. 9 is a IX-IX' sectional view of FIG. 8. As illustrated in FIG. 9, in a detection device 1A of the second embodiment, the first electrode 81A faces the second electrode 82A with the insulating films 24 and 25 interposed therebetween. The first electrode 81A is located in the same layer as that of the gate electrodes 64 and is formed of the same material as that of the gate electrodes 64. The second electrode 82A is located in the same layer as that of the source electrode 62 and the drain electrode 63 and is formed of the same material as that of the source electrode 62 and the drain electrode 63.

Also in the present embodiment, the first and the second electrodes 81A and 82A are provided between the substrate 21 and the photoelectric conversion element 30 in the third direction Dz. The first and the second electrodes 81A and 82A are provided in regions not overlapping the transistors in the plan view.

The configuration of the second embodiment may be combined with that of the first embodiment. That is, in FIG. 9, although the undercoat film 22 and the insulating film 23 are stacked and no electrode is provided between the first electrode 81A and the substrate 21, the first electrode 81 facing the first electrode 81A may be provided in the same layer as that of the semiconductor layer 61 in the same manner as in the first embodiment. In this case, the capacitor Cad is formed by coupling a capacitor formed between the first electrode 81A and the second electrode 82A in parallel to a capacitor formed between the first electrode 81A and the first electrode 81. This configuration can ensure the capacitor Cad even when the detection element 3A has a smaller area.

Third Embodiment

Figure 10:
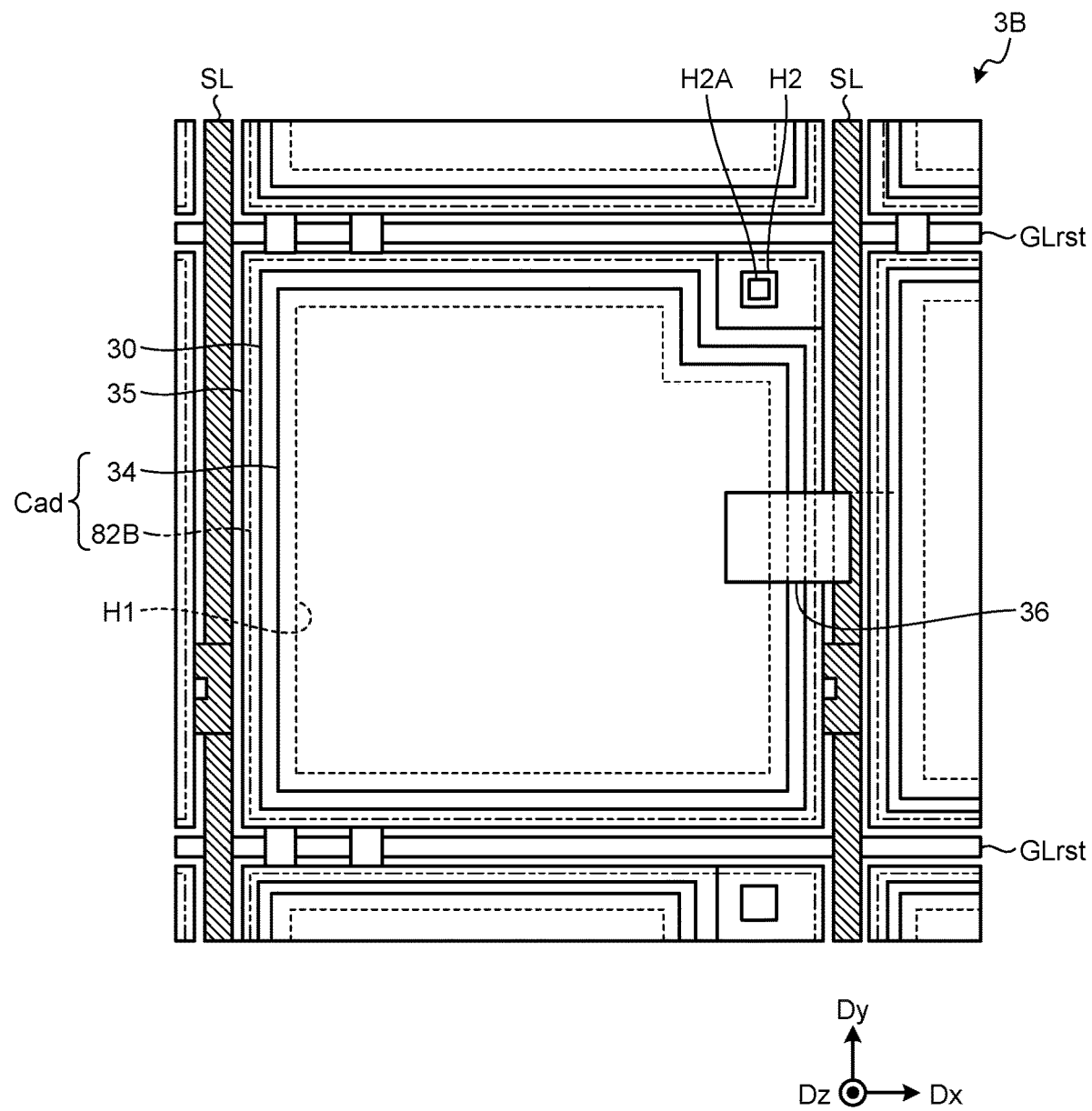
FIG. 10 is a plan view illustrating a detection device according to a third embodiment.

FIG. 10 is a plan view illustrating a detection device according to a third embodiment. As illustrated in FIG. 10, a detection element 3B of the third embodiment includes a second electrode 82B. For ease of viewing, FIG. 10 illustrates the second electrode 82B with a long dashed double-short dashed line.

The second electrode 82B is provided so as to overlap the upper electrode 34. The second electrode 82B and the upper electrode 34 facing each other form the capacitor Cad. That is, the upper electrode 34 corresponds to the first electrodes 81 and 81A of the first and the second embodiments described above. The upper electrode 34 is coupled to the reference potential VCOM in the same manner as the first electrodes 81 and 81A. The second electrode 82B is formed in a rectangular shape to occupy most of a region surrounded by adjacent two of the output signal lines SL and adjacent two of the reset control scan lines GLrst. The second electrode 82B is formed to have a larger area than that of the photoelectric conversion element 30 in the plan view and is coupled to the coupling wiring SLcn (refer to FIG. 11) through a contact hole H2A.

Figure 11:
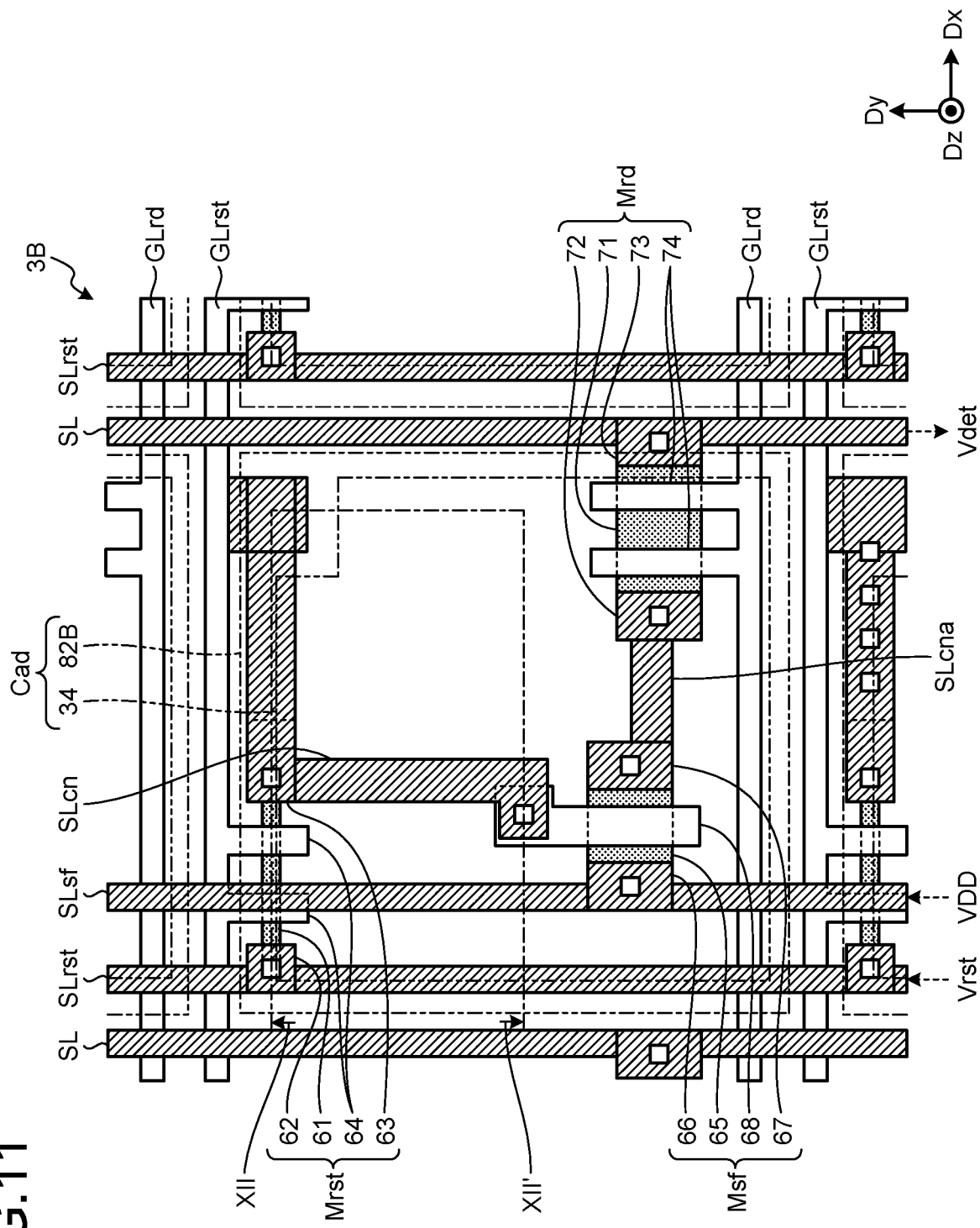
FIG. 11 is a plan view of the array substrate on which a detection element according to the third embodiment is formed.

FIG. 11 is a plan view of the array substrate on which the detection element according to the third embodiment is formed. FIG. 11 illustrates a positional relation between the second electrode 82B and the upper electrode 34 with long dashed double-short dashed lines. As illustrated in FIG. 11, the second electrode 82B and the upper electrode 34 are provided in regions overlapping the source follower transistor Msf, the read transistor Mrd, and the reset transistor Mrst. In other words, the electrodes that form the capacitor Cad are provided in layers different from those of the transistors and are not provided on the array substrate 2 side. The second electrode 82B and the upper electrode 34 are provided separately for each region surrounded by the output signal lines SL and the reset control scan lines GLrst.

Figure 12:
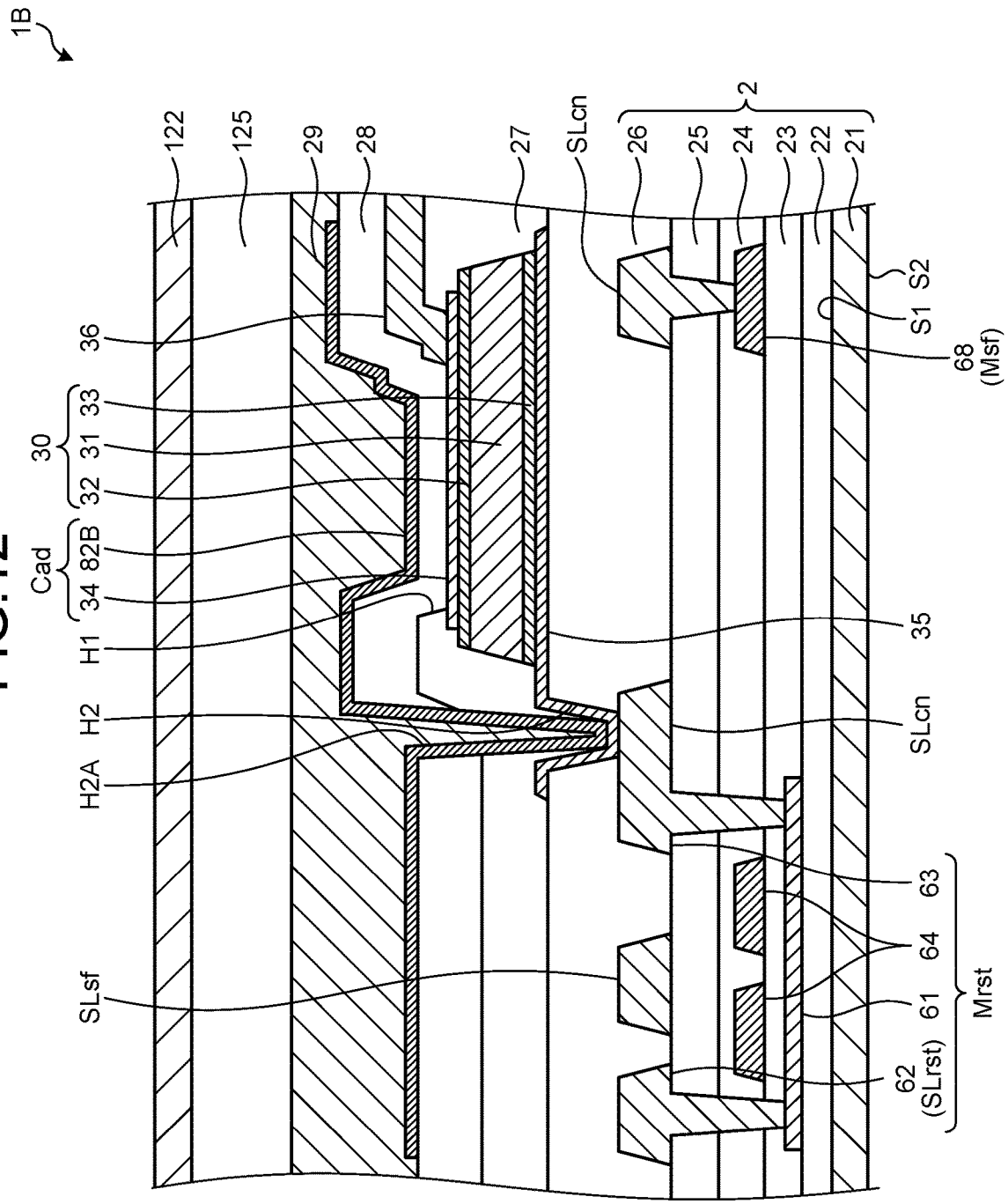
FIG. 12 is a XII-XII' sectional view of FIG. 11.

FIG. 12 is a XII-XII' sectional view of FIG. 11. As illustrated in FIG. 12, the upper electrode 34 is provided on the photoelectric conversion element 30, and the second electrode 82B is provided above the upper electrode 34 with the insulating film 28 interposed therebetween. The second electrode 82B extends to a region not overlapping the photoelectric conversion element 30 and is coupled to the coupling wiring SLcn through the contact hole H2A passing through the insulating films 27 and 28. The second electrode 82B is formed of, for example, a light-transmitting conductive material such as ITO, in the same manner as the upper electrode 34.

The second electrode 82B is provided in a region overlapping the transistors such as the reset transistor Mrst and is less restricted by the transistors and the various types of wiring. Therefore, in the present embodiment, the second electrode 82B can have a larger area than that in the first and the second embodiments described above. That is, the capacitor Cad can be formed to be larger.

The present embodiment can be combined with at least one of the first and the second embodiments described above. That is, the first electrode and the second electrode facing each other with the insulating film interposed therebetween may be provided in a region between the photoelectric conversion element 30 and the substrate 21 that does not overlap the transistors.

While the preferred embodiments of the present disclosure have been described above, the present disclosure is not limited to the embodiments described above. The content disclosed in the embodiments is merely an example and can be variously modified within the scope not departing from the gist of the present disclosure. Any modifications appropriately made within the scope not departing from the gist of the present disclosure also naturally belong to the technical scope of the present disclosure.

What is claimed is:

1. A detection device comprising:
a substrate;
a plurality of photoelectric conversion elements arranged on the substrate;
a plurality of transistors that each comprise a semiconductor layer and a gate electrode facing the semiconductor layer and are provided for each of the photoelectric conversion elements; and
a first electrode and a second electrode that are provided between the substrate and the photoelectric conversion elements in a direction orthogonal to the substrate and face each other with an insulating film interposed between the first electrode and the second electrode, wherein
the first electrode comprises a plurality of main parts that overlap the respective photoelectric conversion elements and a coupling part couples together adjacent main parts of the main parts,
the second electrode is formed to have an island pattern for each of the photoelectric conversion elements,
the first electrode is located in the same layer as that of the gate electrode, and
the second electrode is located in the same layer as that of the semiconductor layer.

2. The detection device according to claim 1, wherein
the first electrode and the second electrode are provided in regions not overlapping the transistors in a plan view, and
the first electrode and the second electrode overlap the photoelectric conversion elements in the plan view.

3. The detection device according to claim 1, wherein at least one of the first electrode and the second electrode has a chamfer obtained by chamfering a corner in a plan view.

4. The detection device according to claim 1, wherein
the photoelectric conversion elements are arranged in a first direction, and
the coupling part of the first electrode electrically couples together the main parts adjacent in the first direction.

5. The detection device according to claim 1, wherein
the first electrode is coupled to a reference potential, and
the second electrode is electrically coupled to the transistors and a corresponding one of the photoelectric conversion elements.

6. The detection device according to claim 1, wherein
the transistors comprise a source follower transistor, a reset transistor, and a read transistor, and
the second electrode is electrically coupled to one of a source and a drain of the reset transistor, and to a gate of the source follower transistor.

7. The detection device according to claim 1, wherein each of the photoelectric conversion elements comprises an n-type semiconductor layer, an i-type semiconductor layer, and a p-type semiconductor layer stacked on the substrate.

* * * * *